United States Patent [19]
Payne et al.

[11] Patent Number: 4,634,970
[45] Date of Patent: Jan. 6, 1987

[54] DIGITAL WAVEFORM PROCESSING OSCILLOSCOPE WITH DISTRIBUTED DATA MULTIPLE PLANE DISPLAY SYSTEM

[75] Inventors: Randall K. Payne; Russell H. Nord, both of Fort Atkinson, Wis.

[73] Assignee: Norland Corporation, Fort Atkinson, Wis.

[21] Appl. No.: 567,055

[22] Filed: Dec. 30, 1983

[51] Int. Cl.⁴ .................... G01R 13/34; G01R 13/22
[52] U.S. Cl. ................... 324/121 R; 324/102; 324/113; 340/720; 340/799
[58] Field of Search ............. 324/121 R, 113, 111, 324/112, 102; 340/722, 723, 726, 731, 798, 799, 800, 801, 720

[56] References Cited

U.S. PATENT DOCUMENTS

| | | | |
|---|---|---|---|
| 3,653,027 | 3/1972 | Scheer | 324/121 R X |
| 3,662,380 | 5/1972 | Cargile | 324/112 X |
| 4,058,826 | 11/1977 | Schneider | 324/88 X |
| 4,283,713 | 8/1981 | Philipp | 324/102 X |

Primary Examiner—Reinhard J. Eisenzopf
Assistant Examiner—Stephen M. Baker
Attorney, Agent, or Firm—Lockwood, Alex, FitzGibbon & Cummings

[57] ABSTRACT

A raster display digital oscilloscope includes an analog to digital converter and a memory array for developing and storing a digital measurement signal amplitude-dependent on an acquired input signal. After processing stored digital signals are conveyed to an output circuit which includes a raster-scanned CRT and three display memory planes independently addressable by the CPU for receiving in discrete address locations the digital data. Corresponding address locations in the three planes are read in synchronism with the CRT scan to develop a display signal for application to the CRT to produce a display corresponding to the sum of the data stored in the three planes. The digital signals are automatically spread out or bunched up within the display planes to compensate for differences between the data acquisition rate and the scan rate.

4 Claims, 10 Drawing Figures

DIGITAL WAVEFORM PROCESSING OSCILLOSCOPE WITH DISTRIBUTED DATA MULTIPLE PLANE DISPLAY SYSTEM

BACKGROUND OF THE INVENTION

The present invention is directed generally to waveform processing oscilloscopes, and more particularly to a raster scan display system for use in such instruments.

In digital type oscilloscopes, an applied analog signal is first converted to a digital signal, the digital signal is stored and/or mathematically processed, and the processed signal is reconverted to an analog signal for display by a cathode ray tube. Such digital oscillscope instruments are particularly well suited for displaying complex signal waveforms where measurements and calculations on selected portions of the waveforms must be performed to provide waveform and numerical output displays indicative of selected parameters of the waveforms. In this regard, digital oscilloscope instruments have the flexibility of providing a wide range of storage, display and processing options, including one-half and one-quarter screen displays and graphics and multiple step processing programs.

To provide a desired output display in digital oscilloscope instruments it is necessary that waveforms and other data to be displayed be read into discrete locations in a memory array. The memory array is then read out location-by-location into a CRT, which is scanned in synchronism with the readout. Where it was required to shift the position of one or more waveforms on the display, it was necessary in prior oscilloscope constructions to shift the data from one location to another in the memory array. This was often a time-consuming operation which interfered with other processing operations in the instrument CPU.

A preferred construction for the display system of a digital oscilloscope, which avoids the need to shift data by providing three discrete simultaneously-read display planes, is shown in the copending application of John R. Figie, "Digital Waveform Processing Oscilloscope with Multiple Plane Display System", Ser. No. 567,225, filed concurrently herewith and assigned to the present assignee. The present invention is directed to a data distribution system for use in this construction whereby data is distributed within the display planes in accordance with the difference between the data acquisition rate and the display rate to provide optimum definition of an acquired waveform in the display.

A preferred calibration system for use in the oscilloscope is shown in the copending application of Terry Schwalenberg, "Digital Waveform Processing Oscilloscope with Automatic Calibration System", Ser. No. 567,092, filed concurrently herewith and assigned to the present assignee.

SUMMARY OF THE INVENTION

The invention is directed to a digital oscilloscope instrument having an input circuit and an analog-to-digital conversion circuit for converting an analog calibration signal applied to the input circuit to a digital data signal. The data signal is read into discrete memory locations in a display array. The memory locations are successively and repetitively read out to a CRT, which is scanned in synchronism with the readout. Data read into the array is distributed among the memory locations in accordance with the difference between the acquisition rate and the scan rate to produce a display of optimum definition.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
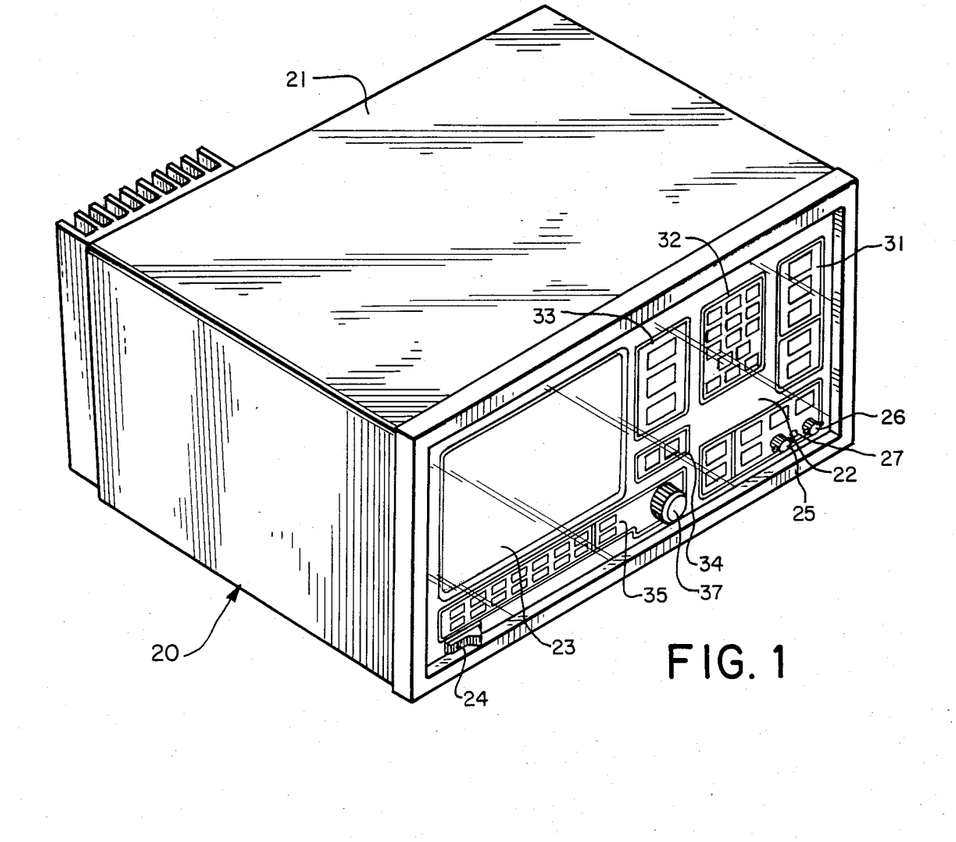
FIG. 1 is a perspective view of the digital waveform processing oscilloscope instrument incorporating an automatic calibration system in accordance with the invention.

Referring to the figures, and particularly to FIG. 1, a digital waveform processing oscilloscope instrument 20 constructed in accordance with the invention is enclosed within a housing 21 of generally rectangular dimensions. A front panel 22 of the housing provides a plurality of user-actuable controls and a display screen 23. A power switch 24 controls power to the instrument, and a pair of coaxial input connectors 25 and 26 are provided for applying signals to the instrument. A test point 27 provides a calibration signal of known amplitude. Additional connectors and controls (not shown) may be provided on the rear panel of the housing to accommodate infrequently used functions and signal input and output requirements.

Figure 2:
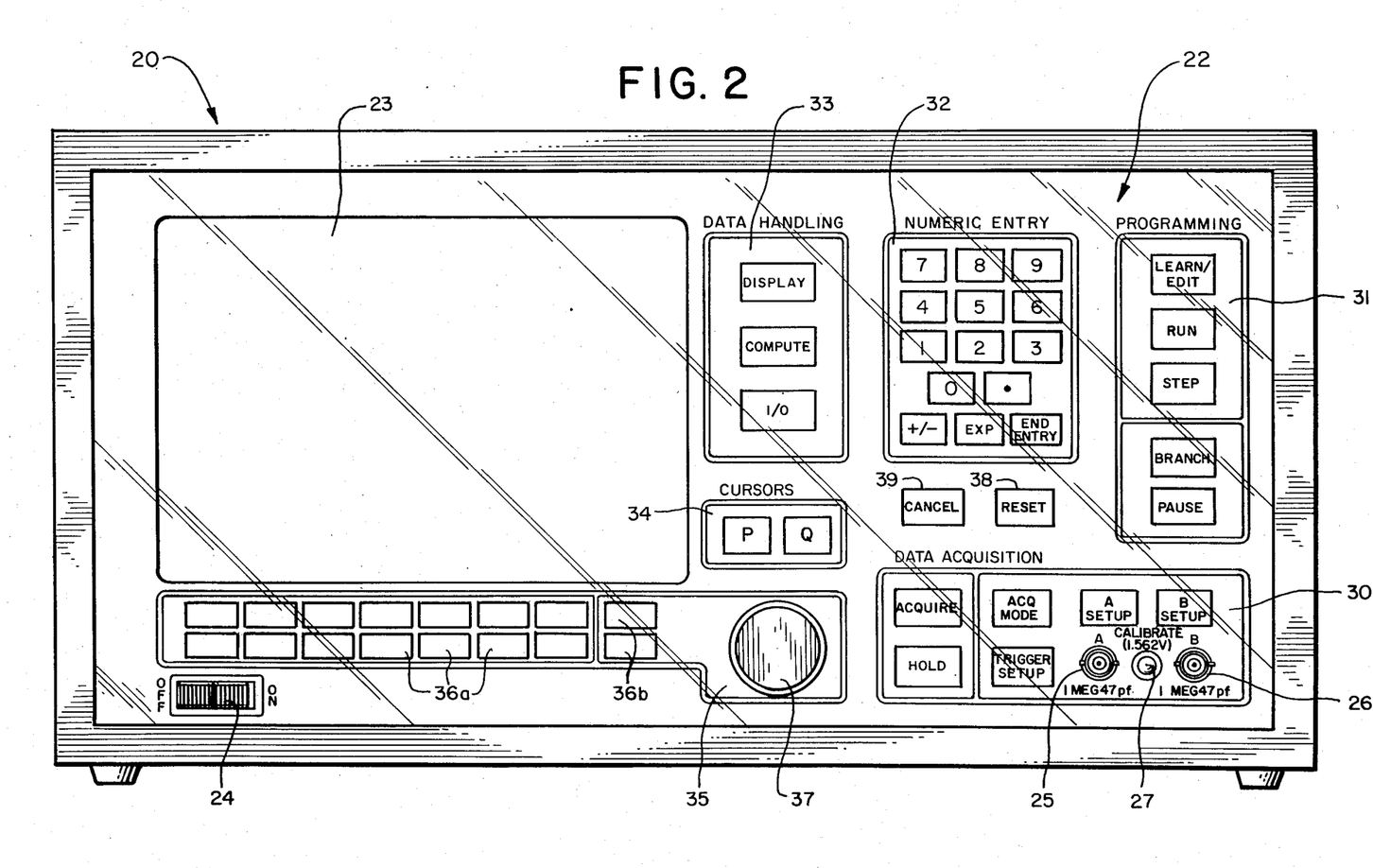
FIG. 2 is an enlarged front elevational view of the instrument showing the control panel thereof.

As shown in FIG. 2, the control panel 22 is seen to include a plurality of push-type controls, or keys, which may comprise pressure-sensitive switches placed behind a seamless front panel bearing appropriate indicia, in a manner well known to the art. The keys ar actuated by simply applying a slight amount of pressure to the panel in the vicinity of the indicia.

The keys are organized into six functional groups 30–35. The first group 30 is concerned with data acquisition and includes A SETUP, B SETUP, TRIGGER SETUP, ACQUIRE, HOLD, and ACD MODE keys, as well as the two coax connectors 25 and 26 and the test point 27. The second group 31 includes LEARN/EDIT, RUN, STEP, BRANCH and PAUSE keys utilized to enter programming commands into the instrument. The third group 32 comprises a numerical key pad and associated +/−, EXP and END ENTRY function keys for entering numeric data and arithmetic functions. The fourth group 33 includes DISPLAY, COMPUTE and I/O keys for controlling the transfer of data within the instrument. The fifth group 34 of keys includes P and Q keys for selecting and positioning cursors on display screen 23 when selecting certain desired features of the displayed waveforms for analysis or processing.

The sixth group 35 of command keys consists of untitled keys 36a and 36b. These keys, termed soft keys, are identified in operation by indicia displayed on the bottom portion of display screen 23 adjacent the keys. In addition, group 35 includes a control knob 37 which can be rotated by the user to position cursors or enter data. This control knob, termed the soft knob, is function-identified by displayed indicia on screen 23 adjacent keys 36b, which perform the same function as the control knob. The ability of the soft keys 36 and soft knob 37 to perform a plurality of different functions in accordance with the operating mode and data input requirements of instrument 20 greatly simplifies operation of the instrument and reduces front panel congestion.

The front panel 22 further includes an ungrouped RESET key 38 which is used to reinitialize or restart the instrument, interrupting data acquisition and maintaining all internal registers intact. An ungrouped CANCEL key 39 is provided to cancel any error conditions which may have occurred and to exit a procedure in process. If this key is pressed during data acquisition, acquisition continues.

For improved user convenience, when a key is pressed a momentary tone is produced by the instrument. This serves as an indication that an entry has been made. A key which is not assigned a function is inactive and does not provide a tone.

Figure 3:
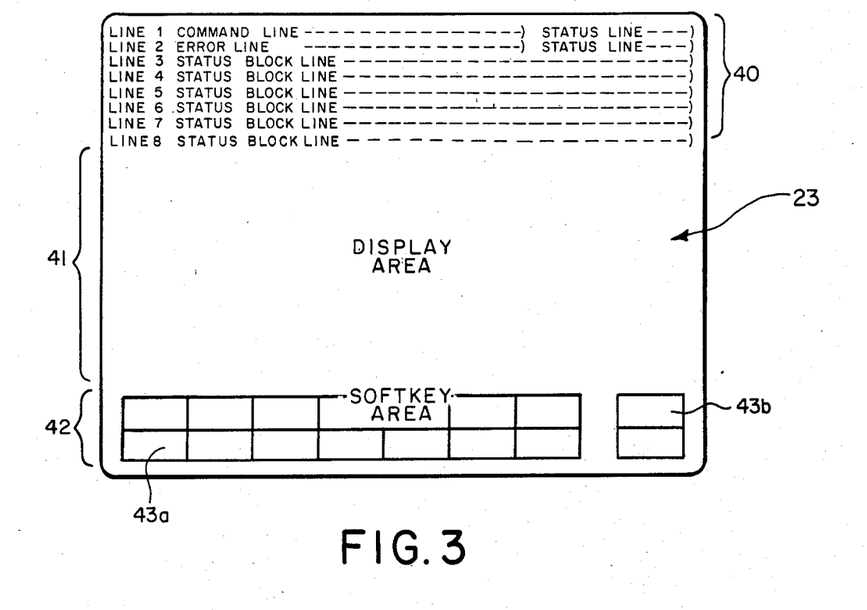
FIG. 3 is an enlarged front elevational view of the display screen of the instrument showing the principal output displays provided thereon.

Referring to FIG. 3, the display screen 23 is seen to include along its top edge an eight line portion 40 within which alphanumeric information relating the waveform under analysis and operating parameters of the instrument are displayed. in particular, line 1 comprises a command line on which the operating mode of the instrument is displayed. Line 2 comprises an error line on which errors or non-logical functions which cannot be performed by the instrument are displayed. Status lines at the ends of lines 1 and 2 provide an indication of the current mode of operation of the instrument.

Lines 3–8 comprise status block lines which display information concerning the status of adjustable features of the instrument. Such information includes acquisition parameters, the operating mode and position of the cursors, the operating mode and contents of system registers, and the operating mode and status of the system display.

Beneath the status block 40 display screen 23 includes a display area 41. Within this area waveforms, either prior to or subsequent to processing as required by the operating mode of the instrument, are displayed.

Below display area 41 display screen 23 includes a soft key indicia diaplay area 42. This display area includes a first group of display locations 43a adjacent the bottom edge of display screen 23 in vertical alignment with respective vertical pairs of soft keys 36a. In operation, indicia are displayed in these areas which correspond to the functions of the respective soft keys. A second group of indicia locations 43b identifies the functions of the soft keys 36b associated with soft knob 37.

By reason of the placement of soft keys 36a and 36b immediately below display screen 23, the indicia displayed in soft key areas 43a and 43b is readily associable with the soft keys. This enables the soft keys to perform a large number of different functions as called for by particular operating modes of the instrument, without undesirably complicating control panel 22 with a large number of dedicated keys.

Figure 4:
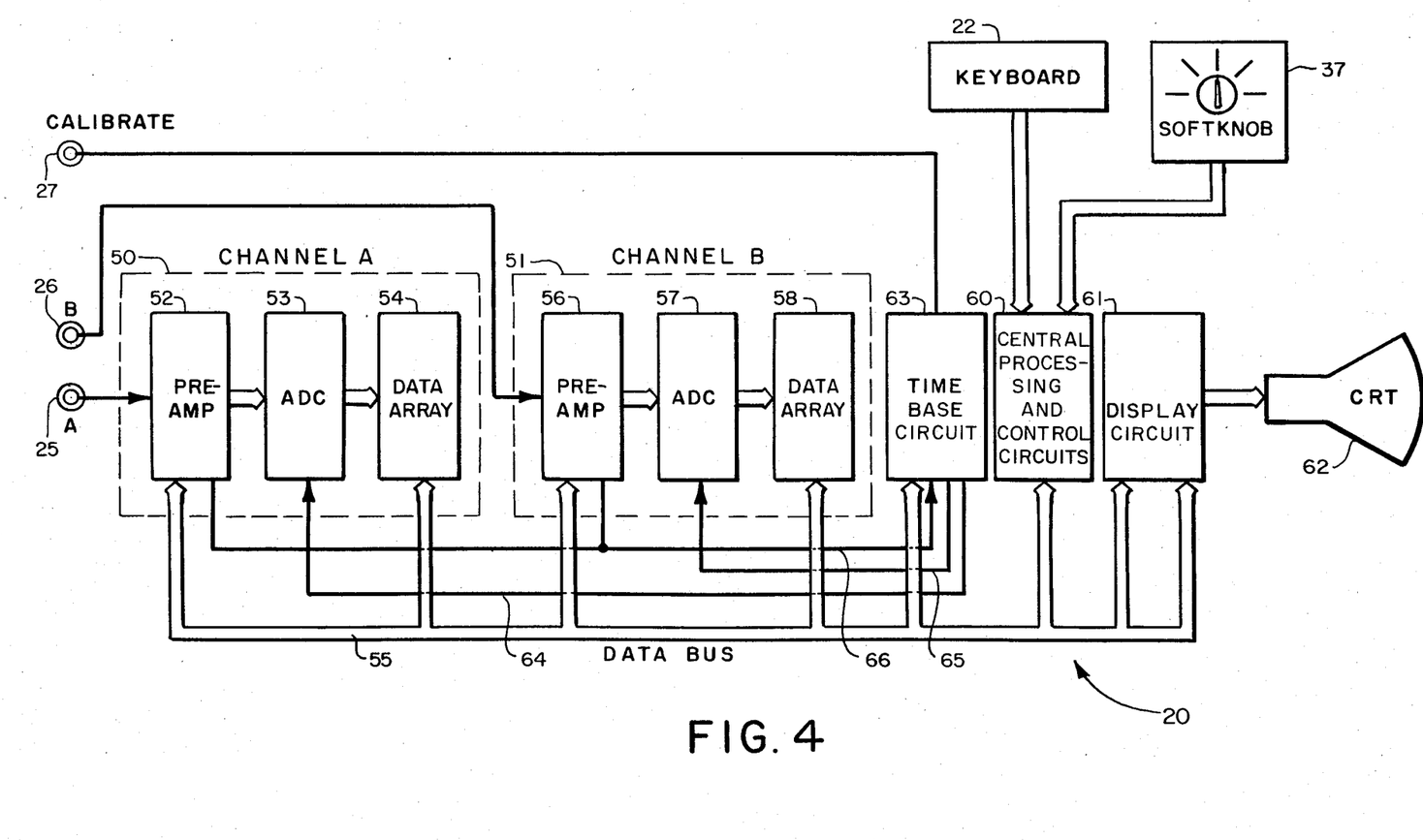
FIG. 4 is a simplified functional block diagram showing the principal circuits of the instrument and their principal interconnections.

Referring to FIG. 4, the waveform processing instrument 20 is seen to basically comprise a channel A input circuit 50 for receiving signals applied to connector 25, and a channel B input circuit 51 for receiving signals applied to connector 26. Within channel A is included a preamp 52 for amplifying the applied signal, an analog-to-digital converter (ADC) 53 for converting the amplified analog signal to a digital signal, and a data array 54 for storing the converted signal. Digital signals are conveyed to and from data array 54 by a data bus 55 for processing and/or display by the instrument.

Similarly, within channel B is included a preamp 56, an ADC 57 and a data array 58 for supplying digital data to data bus 55.

The data derived by input circuits 50 and 51 on data bus 55 is applied to a system processing and control circuit 60. This circuit, termed the system CPU, and which includes a microprocessor and associated read only memory (ROM) and random access memory (RAM) components, simultaneously processes the digital data conveyed by data bus 55 to generate digital waveform and numeric signals for display and/or storage and generates appropriate control signals for application over the data bus to control the operation of other circuits of the instrument. The waveform and numeric output signals on bus 55 are either returned to data arrays 54 and 58 for storage, or are applied through the data bus to a system display circuit 61. Within display circuit 61 the signals are temporarily stored, and then converted to analog signals for display by a raster-type display circuit incorporating a cathode ray tube 62. The microprocessor of processing and control circuit 60 is responsive to user-initiated inputs resulting from actuation of the keyboard controls on control panel 22, or the soft knob system 37 contained thereon.

The acquisition of data by the input channel A and B circuits 50 and 51 is controlled by a system time base circuit 63. This circuit responds to array condition signals developed by the channel A and B circuits and to programmable threshold circuits within the channels to provide trigger signals required for terminating data acquisition after a set delay period thus initiating storage of desired waveforms or portions of waveforms. To this end, the time base circuit 63 may include a continuously running clock circuit, frequency dividing circuits, and other components necessary for generating sampling signals with desired time relationship to an acquired signal. The time base circuit provides sample control pulses to channel A on a first control line 64, and sample control pulses to channel B on a second control line 65. Trigger signals from the preamp circuits of the input channels are applied by a control line 66 to time base circuit 63 to terminate data acquisition after the set delay period upon the occurrence of a triggering condition in an applied waveform.

Figure 5:
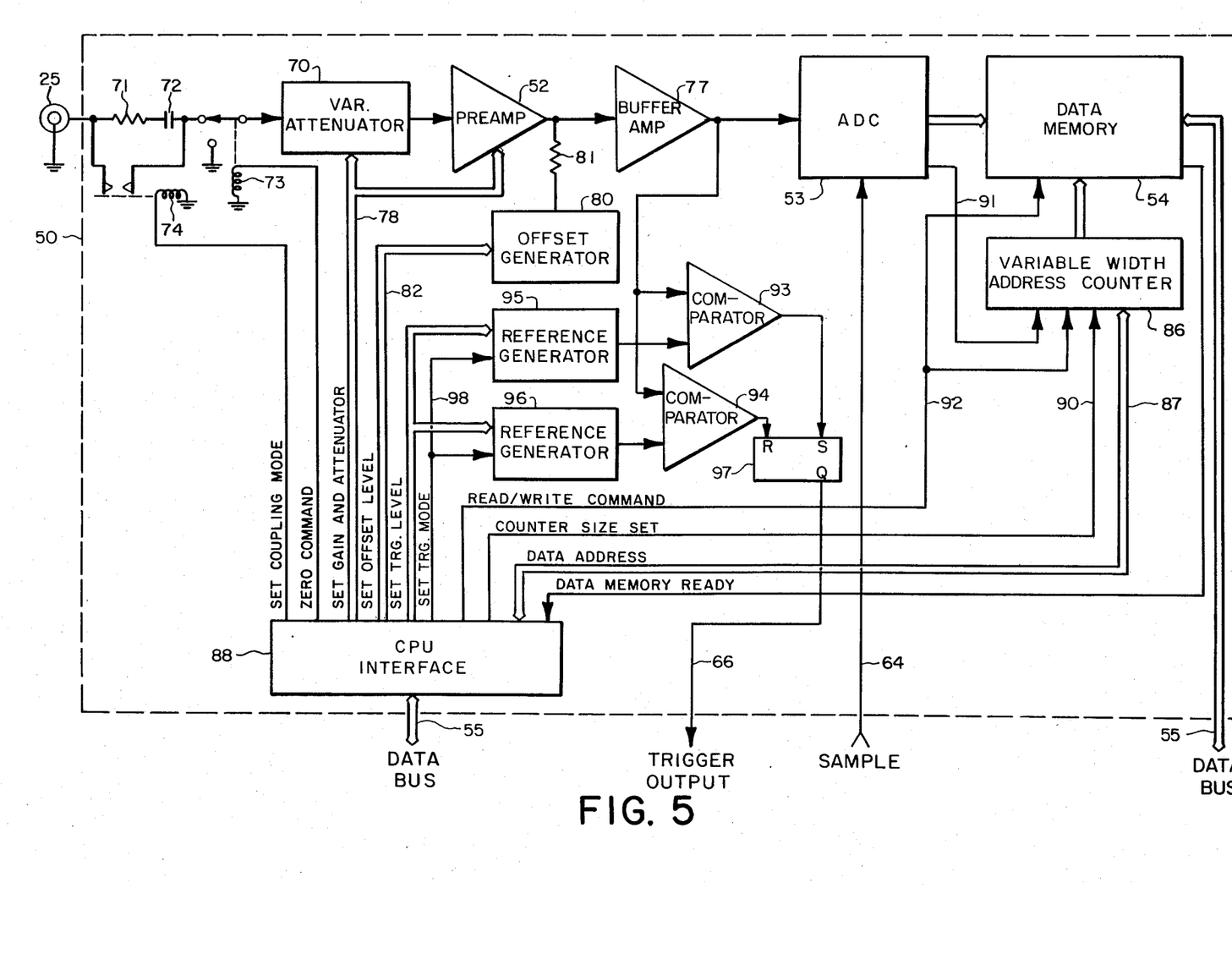
FIG. 5 is a simplified functional block diagram, partially in schematic form, showing the preamp, analog-to-digital and data memory circuits of the A and B signal channels of the instrument.

The two input channels A and B may be identical in construction and operation. Referring to FIG. 5, the A input channel 50 is seen to include a variable attenuator circuit 70. Signals applied to connector 25 are applied to this attenuator through an input network consisting of a series-connected resistor 71, a capacitor 72 and the normally closed contacts of a relay 73. A relay 74 having normally-open contacts connected across resistor 71 and capacitor 72 enables these elements to be selectively shunted. Actuation of relay 73 enables the input of attenuator 70 to be selectively grounded. With relays 74 and 75 non-energized as shown, connector 25 is AC coupled to attenuator 70. The output of attenuator 70 is connected to preamp 52, wherein it is amplified prior to application to a buffer amplifier 77.

The attenuation factor of variable attenuator 70 and the signal gain factor of preamp 52 are dependent on control signals applied to these components on a control line 78. This enables the operating gain of the two input channels 50 and 51 to be selectively controlled in accordance with the operating mode of the processing apparatus. A direct current offset voltage is added to the amplified analog signal from preamp 52 by means of an offset voltgage generatgor 80 and an isolation resistor 81. The level of the offset thus added is dependent on a control signal applied to the offset generator on a control line 82.

The output of buffer amplifier 77 is applied to an analog-to-digital (ADC) conversion circuit 53. This circuit, which may be a conventional flash-type ADC, responds to a sample command signal on control line 64 to convert the then existing applied analog output signal from buffer amplifier 77 to a digital signal for application to the A channel data array memory circuit 54.

The data array 54, which may be a conventional two-port memory circuit, is addressed by means of a variable-width address counter 86 so that data is read into or out of the memory in accordance with the counting state of the counter. One data port of array 54 is unidirectional, for read in of data only, and the other port is bidirectional, allowing both read in and read out from the memory, and is connected to the system data bus 55. In accordance with conventional practice, the two data ports may each accept digital data in parallel form, in the illustrated embodiment of up to sixteen bits in width.

The variable width address counter 86 allows the system to access and control data memory 85 through the two memory input/output ports. Separate counters in the two channels provide independent addresses for the A and B channels. Address counter 86 can be read or written by CPU 60 through a data bus 87 and a CPU interface circuit 88 of conventional construction. By this means, CPU 60 selects the size of the counter and how the counter is incremented. A control line 90 associated with CPU interface 88 is provided for this purpose.

Data memory array 85 can be configured to different memory sizes in accordance with the operating requirements of the apparatus. For example, the user can store data in the entire memory, the first one-half of the memory, or the first one-fourth of the memory. To accomplish this the size of the variable-width address counter 86 is adjustable from ten bits (for one-fourth of a standard 4 K memory) to fourteen bits (all of a 16 K memory). The size adjustment is accomplished by control line 90 and CPU interface interface 88 in accordance with conventional microprocessor data conveyance and control techniques.

In order to provide a data acquisition system which can store data words at a high rate, the data path and counter output is "pipelined". That is, each sample pulse provided on control line 64 causes ADC 53 to convert the then present input signal. Each such sample pulse also increments data memory address counter 86 and causes a data word to be stored. Upon completion of each data conversion by ADC 53, counter 86 is incremented by a control pulse applied through control line 91 before a data word is stored in array 54. Thus, there is a one sample delay between the counter output and the memory address, and there is a three sample delay from data conversion to stored data. That is, two delays are provided in ADC circuit 53 and one delay is provided in data array 54.

Consequently, when data acquisition stops, the counter indicates the address of the last stored data word plus one, and the data taken at the first sample is stored at the original address value plus three. Thus, under control of ADC 53, data is continuously converted and inputed to the data array, and the array contains at any given time the most recent number of data points equal to its memory capacity. For a 16 K memory 16,384 data points are stored in the array. If the entire array is utilized, the array will contain at all times the most recent 16,384 outputs of ADC 53. If only half the memory is utilized, the most recent 8,192 points of data are stored. If one fourth of the data array is utilized, the most recent 4,096 points of data are stored.

The variable-width address counter 86 can also be incremented when data is read or written by CPU 60 instead of by ADC 53. This is accomplished by the CPU interface 88 in response to appropriate command signals on data bus 55. First, address counter 86 is conditioned by the CPU to the memory address at which data is to be read or written. Then, as the CPU reads and writes data, address counter 86 is incremented on each write. Data array 54 and address counter 86 are conditioned to their read and write modes by CPU-generate command signals on data bus 55, conveyed to the array and counter by interface 88 and a control line 92.

When analyzing data it is generally required that the waveform display be synchronized to the occurrence of a particular signal level in the applied waveform. To this end, the A and B input channels each include a pair of comparator amplifiers 93 and 94 which compare the output of buffer amplifier 77 against analog reference signals generated by a pair of reference level generators 95 and 96. The output of comparator 93 is applied to the set input of an RS flip-flop 97. The output of comparator 94 is applied to the reset input of the same flip-flop. Upon a signal level transitioning between the reference level sensed by comparator 93 and the reference level sensed by comparator 94, flip-flop 97 is conditioned to a set state, developing a trigger signal on control line 66 for application to time base circuit 63. Within the time base circuit the trigger signal inhibits or delays the application of further sample control signals to ADC circuit 53, as required by the operating mode of the apparatus.

The reference voltages provided by reference level generators 95 and 96 are determined by the system CPU by means of appropriate control signals conveyed over data bus 55 to CPU interface 88, in a manner well known to the art. In addition, the triggering mode of the reference generators is controlled by means of a control line 98 between the CPU interface and the two reference generators, and the operation of input circuit conditioning relays 73 and 74 is controlled by the CP through data line 55 and the CPU interface.

Thus, the operating parameters of input channels 50 and 51 are under the control of the system CPU in accordance with control signals conveyed on data bus 55. At the same time, data is conveyed to and from the data array 54 by the same data bus. Sample control line 64 and trigger control line 66 synchronize the operation of the time base circuit 63 in accordance with the trigger level of the input signal and the operation of ADC 53.

Figure 6:
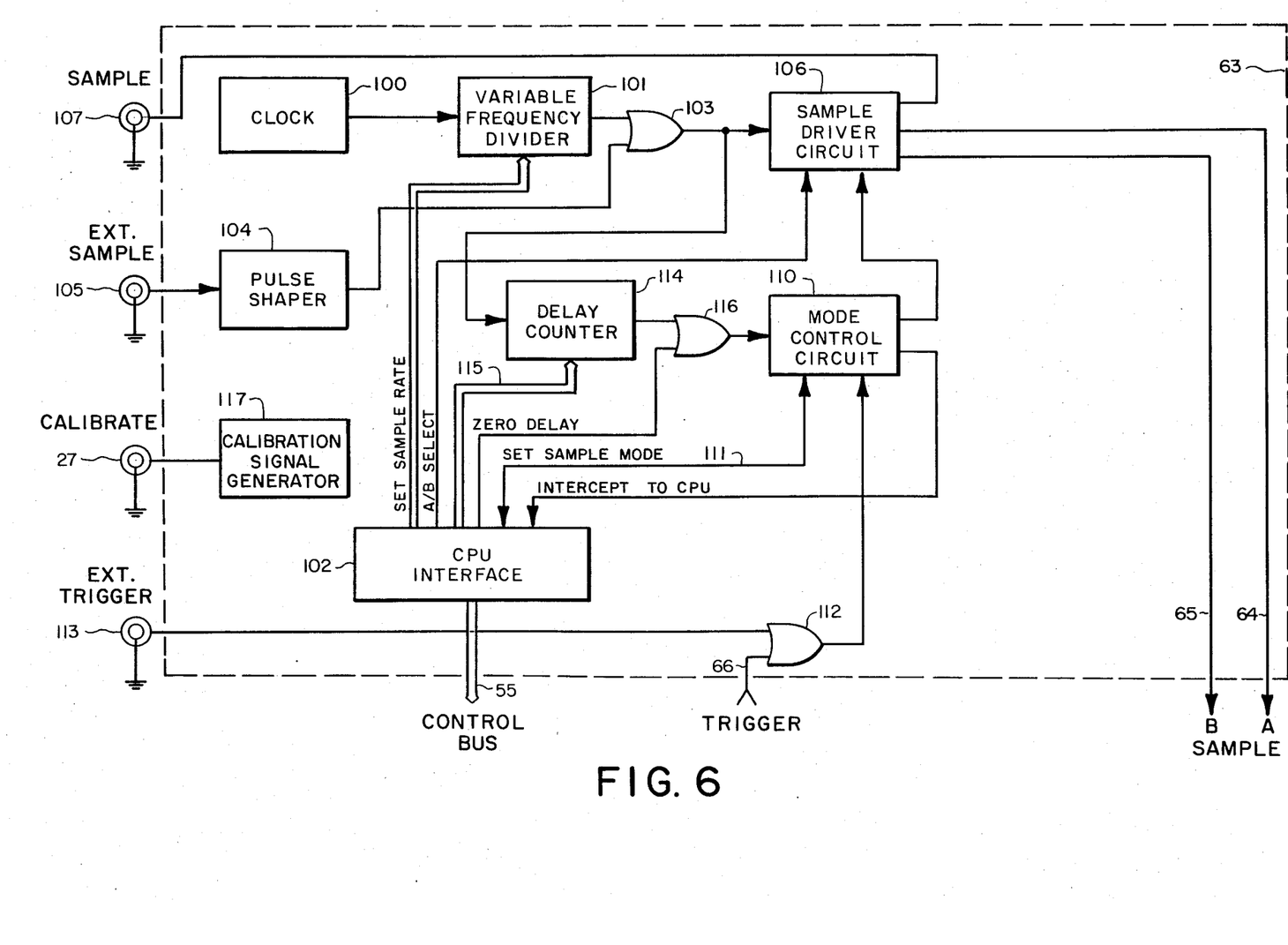
FIG. 6 is a simplified functional block diagram, partially in schematic form, showing the principal components of the time base circuit utilized in the instrument.

Referring to FIG. 6, the time base circuit 63 is seen to include a continuously running clock circuit 100 which supplies pulses at a fixed frequency to a variable frequency divider 101. Divider 101 effects a frequency division to these applied clock pulses in accordance with a sample rate command signal applied to the divider by way of data line 55 and a CPU interface circuit 102. The output of frequency divider 101, which has a frequency in accordance with the rate command signal, is applied to one input of an OR gate 103. The other input of OR gate 103 is connected to the output of a pulse shaper circuit 104, which receives externally applied sample command signals from a connector 105. Consequently, OR gate 103 provides an output pulse upon either the occurrence of a frequency-divided clock pulse, or upon the application of an external sample command signal at connector 105.

The output of OR gate 103 is applied to a sample driver circuit 106, which provides isolated A and B sample command signals on control lines 64 and 65 in accordance with the applied sample signals. In addition, a sample signal is produced at a connector 107 for use in synchronizing external circuitry under analysis by instrument 20.

In a free running mode of the apparatus each frequency-divided clock pulse at the output of OR gate 103 results in the application of sample command signals on control lines 64 and 65. However, in the more usual instance, where triggering to a characteristic of the input signal is required, a mode control circuit 110 within time base circuit 63 is conditioned by an appropriate command produced by the CPU on data bus 55 and conveyed through CPU interface circuit 102 and a data line 111 to cause mode control circuit 110 to inhibit operation of the sample driver circuit 106 upon the occurrence of a trigger pulse on control line 66. To this end, control line 66 is connected through an OR gate 112 to the mode control circuit. Upon receipt of a trigger pulse, mode control circuit 110 inhibits sample driver circuit 106, thereby preventing acquisition of additional data. In the event that external triggering is required, the other input of OR gate 112 is connected to a connector 113 to which external triggering signals can be applied.

In another mode of operation it is required that a portion of the acquired signal at a specific delay period from the trigger point be acquired and displayed. To this end, the frequency-divided clock pulses at the output of OR gate 103 are applied to a delay counter 114. This counter provides an output after a predetermined counting state is reached. The predetermined counting state is entered into the counter by the CPU by means of appropriate command signals over data bus 55. These command signals are applied through CPU interface circuit 102 and a control line 115 to the counter to establish the desired delay period. Since the frequency of the frequency-divided clock pulses is constant, the delay period can be accurately set by the CPU by setting the counting state of the counter. The output of the counter is applied through an OR gate 116 to mode control circuit 110, which responds to the counter output to enable sample driver circuit 106. Where zero delay is required, the CPU provides another command signal by way of data bus 55 and CPU interface 102 to the remaining input of OR gate 116 to cause immediate operation of the sample driver circuit 106. With each enabling output to sample driver circuit 106, mode control circuit 110 provides an intercept signal to the CPU through CPU interface 102 from which the operation of the data acquisition time base circuit 63 can be monitored.

CPU interface circuit 102 also provides an A/B channel select signal for selecting the appropriate sample command signal to be developed by sample driver circuit 106. Also, a calibration signal generator 117 is provided in the time base circuit to provide at test point 27 a square wave calibrating signal of known fixed peak-to-peak amplitude.

In practice, time base circuit 63 can provide sample intervals from one second to fifty nanoseconds. With a representative clock frequency of 20 megahertz, for example, the delay counter 114 can be set from 0 to 65,536 in sample increments of 16 by the CPU.

Mode control circuit 110 provides for operation in four operating modes:

1. Hold—allows no sample pulses.
2. Release—allows continuous sample pulses.
3. Wait trigger—Allows continuous sample pulses but enters wait delay state after a trigger is received.
4. Wait delay—Allows continuous sample pulses but enters a hold state after the delay is complete.

Figure 7:
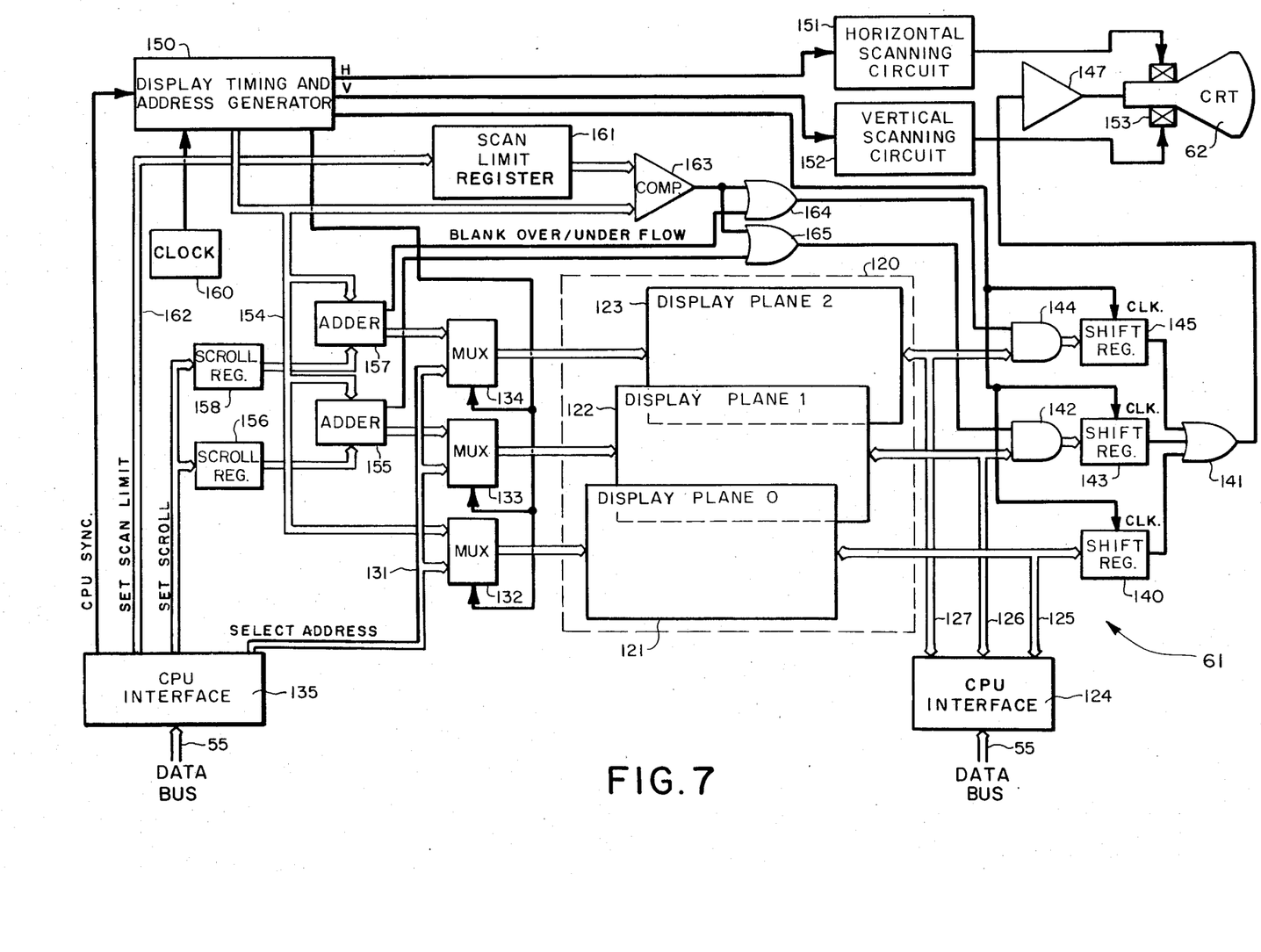
FIG. 7 is a simplified functional block diagram, partially schematic in form, showing the principal components of the display circuit utilized in the instrument.

Referring to FIG. 7, the system display circuit 61 includes a memory array 120 which contains three independent memory planes 121, 122 and 123. Data is written into each of these planes by way of data bus 55 and a CPU interface circuit 124, which is connected to bidirectional data ports of respective ones of the data planes by data lines 125, 126 and 127. The CPU interface circuit 124 operates under the control of the CPU in accordance with command signals provided over data bus 55 in a conventional manner.

The particular memory locations to which data is written or read in memory planes 121–123 is determined by an address transmitted over data bus 55 by the CPU. When entering data into the data planes, the address is applied to the address control inputs of the data planes by multiplex switch circuits 132–134 and a second CPU interface circuit 135 in the display circuit. A data bus 136 conveys appropriate address and control signals from interface 135 to the data planes.

The purpose of memory planes 121–123 is to provide overlapping displays on display screen 23 which, when viewed by the user, appear as a single display. This use of individual memory planes to form the display enables the data in each plane to be independently manipulated relative to the other plane, allowing super-positioning of data as may be required in making a particular analysis of a particular waveform.

The data port of memory plane 121 is connected through a shift register 140 to one input of an OR gate 141. The data port of memory plane 122 is connected through an AND gate 142 to a shift register 143. The data port of display plane 123 is connected through an AND gate 144 to a shift register 145. The outputs of shift registers 143 and 145 are connected to respective remaining inputs of OR gate 141, and the output of this OR gate is connected through an amplifier 147 to cathode ray tube 62. With this arrangement, the data read out from display planes 121–123 is combined to form a single display on display screen 23.

Once data has been read into display planes 121–123, the three display planes are simultaneously scanned and read out as a single display on CRT 62. To this end, display circuit 61 includes a display timing and address generator 150 which provides horizontal and vertical control signals for controlling the operation of horizontal and vertical scanning circuits 151 and 152. These scanning circuits provide, in a manner well known to the art, deflection signals for application to a deflection yoke 153 or other appropriate means for sweeping the electron beam of the cathode ray tube. The operation of the scanning circuits is such that the phosphor face of the CRT is continuously swept, left to right, and top to bottom, at predetermined sweep frequencies. This results in the production of a raster extending over the phosphor face of the CRT.

At the same time, and in synchronism with the scanning of the CRT face the display timing and address generator 150 provides on a data line 154 sequentially increasing horizontal (X) and vertical (Y) address signals which advance location by dot across the three display planes 121–123. During display mode operation, multiplex switches 132–134 direct the display addresses on data line 154 to the address port of the display planes.

Since the applied address instruction from generator 150 corresponds to the sweep of the CRT beam, the data contained in the three display planes for each X and Y address location, or pixel, after conversion by shift registers 140, 143 and 145, appears at the appropriate instant at OR gate 141 for application to CRT 62. Consequently, the CRT display corresponds to the sum of the data stored at the corresponding memory location in the three data planes. This enables two separate waveforms stored in data planes 122 and 123 and alphanumeric data stored in memor plane 121 to be concurrently displayed. Ordinarily, one waveform is stored in memory plane 123 and another waveform is stored in memory plane 122. These memory planes can then be manipulated relative to each other to superimpose or otherwise establish a desired positional relationship between the waveforms. At the same time, memory plane 121 provides alphanumeric information associated with operation of the instrument.

To allow memory plane 122 to be repositioned, or scrolled, on CRT 62 an adder circuit 155 is interposed between data line 154 and multiplex switch 133. The output of a scroll register 156 is applied to the other input of the adder. In operation, the adder provides an address which comprises the sum of the data level of the address output of generator 150 and the output of scroll register 156. To provide the desired scrolling action the system CPU by way of data bus 55 and CPU interface circuit 135 provides an address instruction to scroll register 156 which causes that register to assume a counting state which, when added to the scan address, causes the desired displacement, or scrolling, of the display.

Similarly, the output of display address data line 154 is provided through an adder 157 to multiplex switch 134. The other input of adder 157 receives the output of a second scroll register 158, which is under control of the system CPU to provide a desired scrolling of the output of memory plane 123. A clock circuit 160 provides necessary drive signals for the display timing and address generator 150.

To prevent scrolling beyond display screen 23, the display circuit 61 includes a scan limit register 161. The CPU sets a scan limit by means of command signals on data bus 55, CPU interface circuit 135 and a data bus 162. The output of the scan limit register is compared against the display scan output of generator 150 by a comparator 163. Upon the occurrence of a comparison, indicating that a scan has reached its display limits, blanking is accomplished through OR gates 164 and 165 which supply blanking signals to AND gates 144 and 142, respectively, to prevent data from the associated memory planes from being displayed by CRT 62.

In the event the output of adders 155 and 157 exceeds the scan limit, as in the event of scrolling beyond the display limits, blanking signals are provided by these adders to respective ones of OR gates 164 and 165 to blank the output of the associated one of the display planes.

The two scroll registers 156 and 158 are independently addressed by the system CPU by way of data bus 55 and CPU interface circuit 135 to allow for independent scrolling of the two displayed waveforms. Shift registers 140, 143 and 145 are periodically clocked to provide desired analog output signals for CRT 62 by control signals developed by display timing and address generator 150.

Thus, in normal operation data is read into and out of memory planes 121–123 by the system CPU through data bus 55 and CPU interface circuit 124. Appropriate addresses are supplied to the memory planes during this read-write operation by the system CPU through data bus 55 and CPU interface circuit 135.

Data for display is periodically read from the three display planes by application of progressively increasing data addresses applied to the three data planes by display timing and address generator 150. With the application of each such address an address location is simultaneously read from each of the memory planes, converted to an analog signal by registers 140, 143 and 145, and combined by OR gate 141 for application to CRT 62. The movement of the scanning beam is synchronized with the generation of the display addresses by generator 150, so that the resulting display on screen 23 corresponds to the content of the three memory planes.

In practice, each of the three display planes 121–123 may have, for example, a capacity of 640 dots, or memory locations. However, only 512 memory locations (64 bytes) may be included in the field of scan. The remaining 128 memory locations may be allocated for the horizontal retrace interval. Thus, each memory plane may have the capacity of 253 horizontal lines of 512 display positions each. An additional 17 lines may be allocated to the vertical retrace interval. Overscan limit register 161, comparator 163, and OR gates 164 and 165 prevent information from being displayed during the horizontal and vertical retrace intervals.

The three display planes are in effect laid one atop the other, characters being stored in plane 121, a first waveform being stored in plane 122, and a second waveform being stored in plane 123. The capability of independently scrolling memory planes 122 and 123 allows the relative positions of the waveforms stored by these planes to be changed as desired by the operator. This is particularly useful in comparing the two waveforms.

Figure 8:
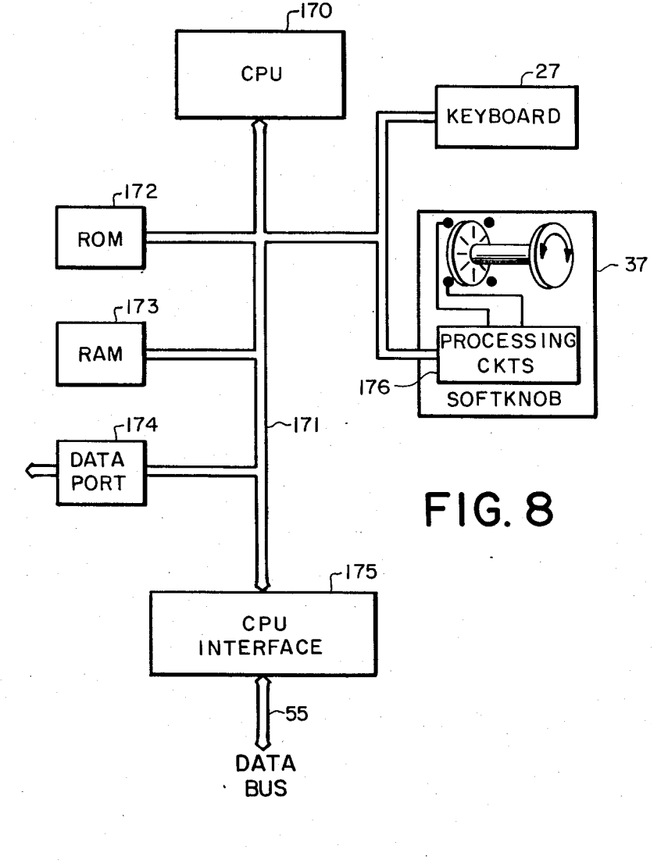
FIG. 8 is a simplified functional block diagram of the central processing unit circuit utilized in the instrument.

Referring to FIG. 8 the system processing circuit 60 of instrument 20 includes a microprocessor 170 of conventional construction. Associated with processor 170, and connected thereto by a conventional data bus 171, are a read only memory (ROM) 172, a random access memory (RAM) 173 and a data port 174, all of conventional construction. Data port 174 may provide for data input and output from data bus 171 in a desired data format, such as RS 232, in a manner well known to the art. Data bus 171 is connected with the system data bus 55 by a CPU interface circuit 175 of conventional design. The system keyboard 27 and soft knob system 37 are also connected to data bus 171. Soft knob system 37 may include a processing circuit 176 for translating rotary motion imparted to control knob 37 by the user to appropriate digital-format signals on data bus 171.

In operation, an appropriate operating program is made resident in ROM 172 during initial manufacture of the instrument. This resident program, or operating system, provides instructions on data bus 171 which cause processor 170 to respond to operator inputs from keyboard 27 and soft knob 37 by providing control and data signals on data bus 55 for controlling the operation of input circuits 50 and 51, display circuit 61, and time base circuit 63.

Instrument 20 includes, in accordance with the invention, a memory-buffered raster-type display system which enables data acquisition and data display to be accomplished simultaneously and independently. The operation of the data acquisition and display circuits of the instrument are controlled by the operator by means of the previously described input keys on the instrument front panel.

Figure 9:
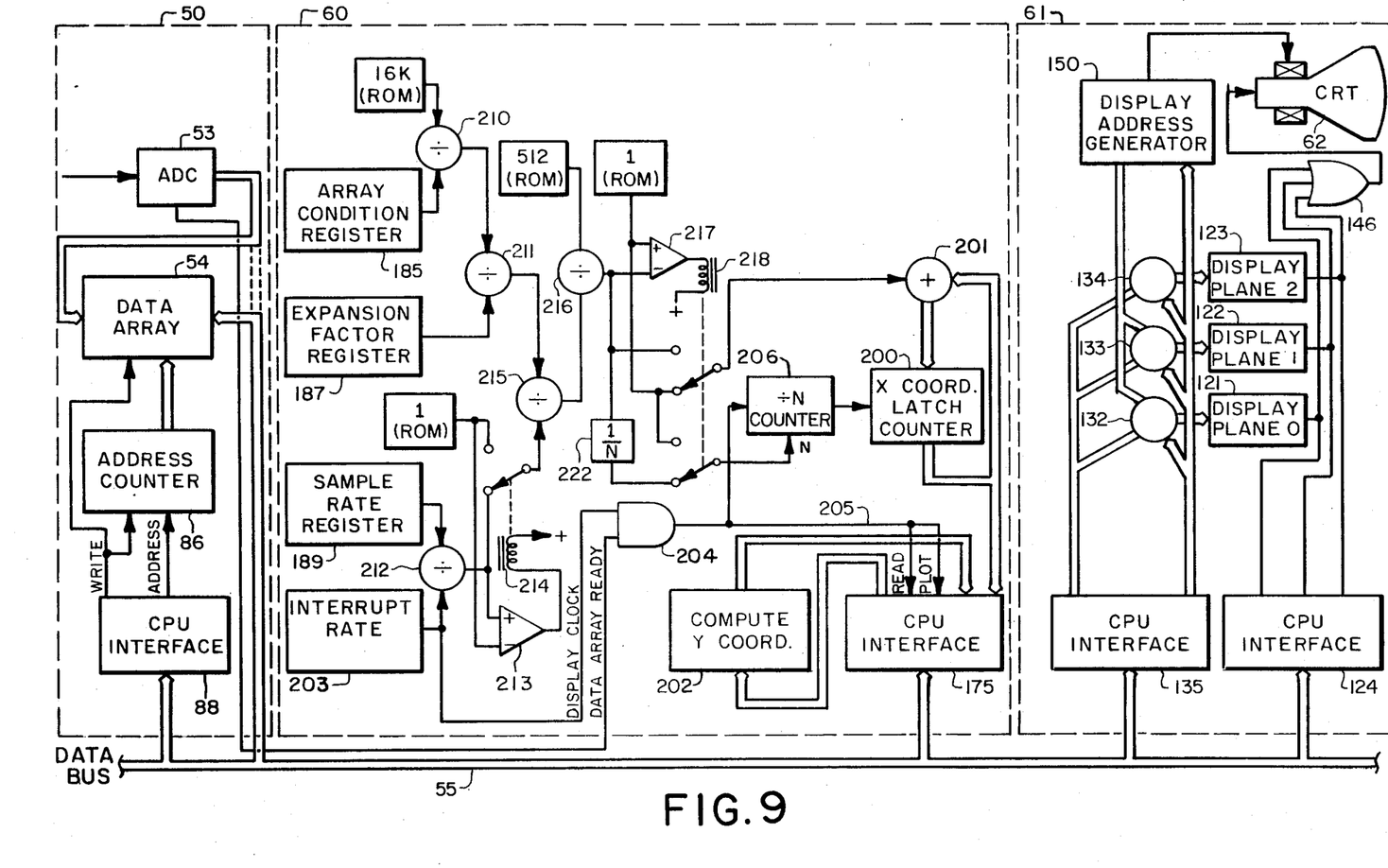
FIG. 9 is a simplified functional block diagram, partially in schematic form, showing principal components of the instrument as interconnected in operation to develop array condition, expansion, and sample rate constants.

Referring to FIG. 9, prior to operation it is necessary for the operator to input by means of keyboard 27 and soft knob 37 the desired display parameters. These parameters include, among others, the display width, the display time base, the display amplitude, and the display format. The required parameters are entered by pressing the DISPLAY key in key group 33, which causes appropriate status blocks and a soft key menu to appear on display screen 23. At that time, by actuation of various ones of the soft keys, display selection, expansion and storage are possible. In addition, the P and Q cursors can be selected and positioned, and the size of the display array can be set.

Within the CPU 60 the various operator-initiated display control inputs cause signals indicative of the selected modes to be placed in temporary storage. In the CPU-equivalent system shown in FIG. 9, acquisition mode parameters are preserved within an acquisition mode register 180, display parameters are stored within a display parameter register 181, memory parameters are stored within a memory parameters register 182 and operating mode parameters are stored within an operating mode register 183. Then, by means of a resident operating program stored within ROM 172, the display parameters temporarily stored in registers 180-183 are utilized to calculate certain factors required for providing the desired operating features in system display circuit 61. Specifically, an array condition calculation, which determines what portion of data array 54 will be displayed, is made by processing circuit 184 for storage in an array condition register 185. Additionally, an expansion factor, which determines what portion of a stored waveform will be displayed, is calculated for temporary storage in an expansion condition register 187. This is often valuable in the case of a particular waveform feature such as a transient phenomena, which constitutes a very small portion of a waveform and would otherwise be unintelligible.

Furthermore, CPU circuit 60 may calculate by means of a circuit 188 a sample rate for storage in a sample rate condition register 189. This is the rate at which the acquired data is sampled by ADC 53, and varies in accordance with operator inputs.

Figure 10:
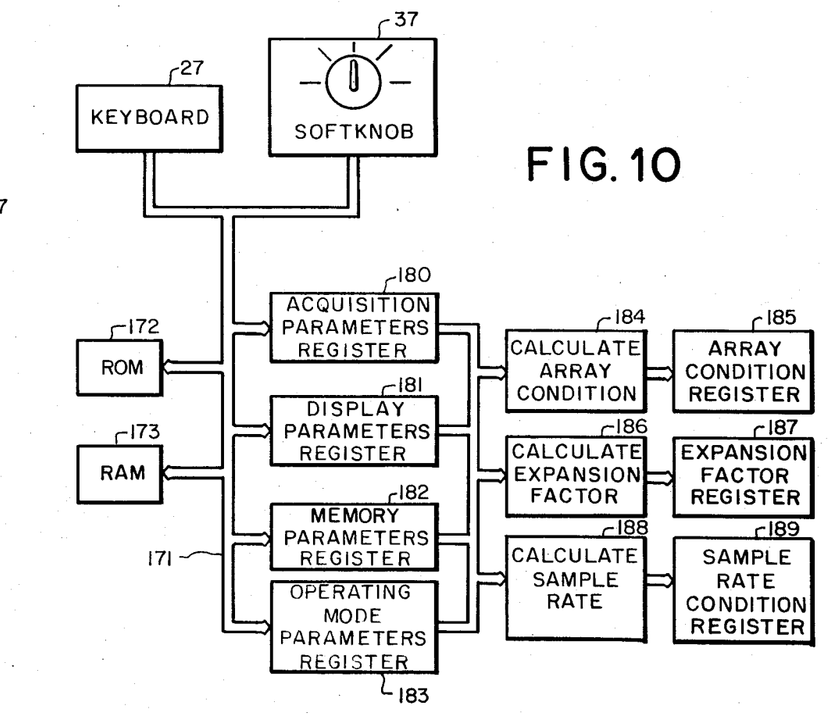
FIG. 10 is a simplified functional block diagram showing principal components of the instrument as interconnected in operation to distribute acquired data in the display memory.

Referring to FIG. 10, within the CPU circuit 60 horizontal (X) addresses for controlling the writing of data into display planes 121-123 are generated by an X coordinate latch counter 200. This counter, which may be conventional in design and operation, assumes the counting state of an applied digital data signal upon application of a clock pulse to its clock input terminal. The output of the counter is applied to the display planes through CPU interface 175, data bus 55, and CPU interface 135. To provide a progressively increasing X address, the output of counter 200 is applied back to the input of the component through an adder circuit 201. With applied clock pulse the counter assumes the previous count plus the amount added by the adder circuit.

Vertical (Y) addresses for controlling the writing of data are provided by a Y coordinate computing circuit 202. Data from data array 54 is applied to this circuit through CPU interface 175. The applied data is converted to a corresponding Y address, which is applied to the display planes through CPU interface 175, data bus 55 and CPU interface 135 concurrently with the X address from counter 200.

Timing pulses for controlling the entry of data into display planes 121-123 are provided by an interrupt clock circuit 203. These timing pulses are applied to one input of an AND gate 204. The other input of AND gate 204 is connected to data array 54, which provides a ready signal which enables the AND gate when the array is to write data. When thus enables, AND gate 204 provides plot control pulses on a line 205 for application through CPU interface 175, data bus 55 and CPU interface 88 to array 54 to cause that device to write, and for application through data bus 55 and CPU interface 135 to condition address switches 132-134 to receive a data entry into the data plane.

To cause the X coordinate latch counter 200 to advance with each data entry plot control pulses are applied to the latch counter through a divide-by-N counter 206. As will be seen presently, this counter is capable of introducing a variable division factor to delay the advance of the X coordinate latch 200 under appropriate circumstances.

As data is being written into the three display planes 121-123, the planes are being periodically read under control of display address generator 150 to provide an output on cathode ray tube 62. The reading of information into the display planes is synchronized to the availability of data points from the ADC to enable AND gate 204 upon the data array 54 being ready to output data. Then, upon application of an interrupt rate signal to the other input of AND gate 204 from a display clock 203 AND gate 204 is caused to output a plot display signal on control line 205. This signal is applied directly through CPU interface 175 and data bus 55 to display circuit 61, wherein it conditions the memory planes 121-123 to receive input data. At the same time, the plot control signal on line 205 is applied as a read control signal through CPU interface 175 and data bus 55 to cause data to be read from data array 54. Thus, with each advance of latch counter 200 a subsequent pixel is addressed in the designated one of display planes 121-123. The particular one of these display planes actually being written is under control of the processor unit by way of the CPU interface 124 and associated circuitry.

It will be appreciated that the entry of data into the display planes takes place independently for each plane. That is, one data plane may be first written, then a subsequent data plane may be written, and finally the third data plane may be written.

As data is read from data array 54 it is applied through CPU interface 88 of the input channel, data bus 55 and CPU interface 175 to Y coordinate compute circuit 202. Within circuit 202 the data is converted from its numerical 16 bit form in array 54 to a Y coordinate corresponding to the Y addresses of display planes 121-123. The resulting Y coordinate is applied through CPU interface 175, data bus 55 and CPU interface 135 to address a particular memory position in the then addressed one of display planes 121-123.

Thus, at any given time the particular memory location addressed is dependent on the counting state of X coordinate latch 200 and the Y address generated by computing circuit 202. A discrete display plane pixel position is addressed by each such pair of coordinates.

Once condition registers 185, 187 and 189 have been set in accordance with the display control commands provided by the operator, display system 61 provides in accordance with the invention, a display in which the data is automatically distributed in display data planes 121-123 in accordance with the acquisition and display operating parameters set by the operator. To this end, within processing unit circuit 60, the output of the array condition register 185, which designates whether the entire register or a fraction such as one-half or one-fourth etc. will be displayed, is applied to a divider circuit 210 wherein it is divided into the array size (16 K in the present embodiment) to determine the number of data points present in the particular array being displayed.

Next, this result is applied to a divider circuit 211 wherein it is divided by the output of the expansion factor register 187, which represents the particular portion of the display to be displayed. At the same time, the output of the sample rate register 189, which corresponds to the acquisition rate of the A and B input channels, is applied to a divider circuit 212. There, the sample rate is divided by the interrupt rate as provided by a suitable signal source. In the present embodiment the interrupt rate is fixed at, for example, 2.52 kHz. If the output of divider circuit 212 is greater than unity, indicating that the sample rate is higher than the interrupt rate, and that the display will be unable to keep up with the acquisition of data, a comparator amplifier 213 is caused to actuate a relay 214. If the sample rate is equal to or less than the fixed interrupt rate, the display will keep up with data acquisition and relay 214 will not be actuated.

The output of divider circuit 211, which represents the number of horizontal data points to be displayed in accordance with the operator's instructions regarding array size and array expansion, is applied to a third divider circuit 215. The other input of divider circuit 215 receives a signal in accordance with the position of the contacts of condition relay 214. If relay 214 is not energized, a factor of unity is applied to divider 215 and the output of the divider corresponds to the output of divider 211. If relay 214 is energized, the output of divider 211 is divided by the ratio between the sample rate and the interrupt rate, as appearing at the output of divider circuit 212.

The output of divider circuit 215 is applied to a fourth divider circuit 216, wherein it is divided into a constant 512, representing the number of horizontal display positions, or pixels, in the three data planes. This is a fixed number, which may be stored in a ROM in accordance with conventional practice. The resultant signal from divider 216, representing the number of data points to be assigned to each display pixel, is applied to a comparator amplifier 217. If the number is greater than unity, indicating that it will be necessary to spread out the available data points among the available pixel display positions, comparator amplifier 217 does not produce an output and an associated relay 218 is not actuated. Conversely, if the output of divider circuit 216 is less than unity, indicating that a larger number of horizontal data points are to be displayed than there are pixel display positions available, comparator amplifier 217 actuates relay 218.

The writing of data into display memory planes 121-123 is under the control of the X coordinate latch counter 200. The counting state of latch counter 200 comprises the horizontal portion of the address of the particular data position, or pixel, into which data is to be read by CPU circuit 60. That is, the output of the latch counter provides an X address which is applied through CPU interface circuit 175, data bus 55, and CPU interface 135 and address switches 132-134 to the display planes, wherein it directs the entry of data conveyed through data bus 55 and CPU interface 124 to specific memory locations. As the count of the latch counter 200 increases, the address of the pixel into which data is to be read is increased. Thus, by controlling the counting state of X coordinate latch counter 200 it is possible to address each acquired data point from array 54 to a particular pixel.

In accordance with the invention, the counting state of the X coordinate latch counter 200 can be advanced or retarded relative to the interrupt rate to provide either a spreading out or a bunching up of data points. This allows a fixed number of display pixels to provide high display definition over a wide range of acquisition rates.

Specifically, if relay 218 is not actuated, indicating that the number of data points to be displayed is equal to or less than the interrupt rate, then the X coordinate latch counter 200 is clocked through divider circuit 206 after N plot control pulses. This number corresponds to the inverted output of divider 216 by reason of an inverter 222 connecting the divider 216 to divider counter 206.

By reason of relay 218, adder 201 adds a one to the output address of latch counter 200, causing the counter to advance only one count with each applied clock pulse from pulse divider counter 206. Since clock pulses are applied only after N counts, a proportional banding of the data signals is obtained as several data signals are read into each data location prior to advancing to a new address.

Conversely, if relay 218 is energized, indicating a lesser number of data points than pixels, the output of divider circuit 216 is applied to adder 201. This causes X coordinate latch counter 200 to advance by N counts upon each clock pulse. Since pulse divider counter 206 has a factor of unity at this time one clock pulse is applied with each data entry control pulse, and consequently data is entered into pixels spaced by N.

Thus, an available number of data points is automatically evenly allocated among an available number of pixel display locations. This allows the oscilloscope to provide a true representation of an acquired waveform, regardless of deficiencies in allocation rates.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A raster-display digital oscilloscope instrument, comprising:
  input circuit means for deriving and storing at a predetermined constant acquisition rate digital data signals indicative of the level of an applied signal;
  at least one display plane having a plurality of memory locations;
  means for conveying said data signal in succession from said input circuit means to individual memory location in said display plane;
  a cathode ray tube;
  display circuit means operatively associated with said cathode ray tube and said display plane for successively and repeatedly reading out at a predetermined display rate said memory locations to said cathode ray tube; and
  data distribution means for directing N successive data signals to each memory location when said acquisition rate is greater than said display rate to substantially evenly distribute every KN the data signal among said memory locations, where K and N are positive integers and N is greater than one.

2. A raster-display oscilloscope as defined in claim 1 wherein said display plane is addressed by a counter, and said counter is advanced only after a predetermined number of data signals have been written into the display plane.

3. A raster-display oscilloscope as defined in claim 2 wherein said counter is a latch counter responsive to an applied clock pulse, and said clock pulse is provided by a variable-division-factor counter responsive to each writing of data signals.

4. A raster-display oscilloscope as defined in claim 3 wherein the division factor of said latch counter is dependent on the ratio of data acquisition rate to data display rate.

* * * * *